(12) United States Patent
Dahle et al.

(10) Patent No.: US 7,039,540 B1
(45) Date of Patent: May 2, 2006

(54) APPARATUS, SYSTEM, AND METHOD FOR TESTING AN ANALOG TO DIGITAL CONVERTER

(75) Inventors: Jacob Lee Dahle, Tucson, AZ (US); Larry LeeRoy Tretter, Tucson, AZ (US)

(73) Assignee: International Business Machines Corporation, Armonk, NY (US)

( * ) Notice: Subject to any disclaimer, the term of this patent is extended or adjusted under 35 U.S.C. 154(b) by 6 days.

(21) Appl. No.: 10/966,596

(22) Filed: Oct. 15, 2004

(51) Int. Cl.
*G06F 19/00* (2006.01)
*H03M 1/10* (2006.01)

(52) U.S. Cl. ............ 702/108; 702/118; 702/126; 341/120

(58) Field of Classification Search ........ 702/108, 702/109, 117, 118, 119, 122, 124, 126, 189, 702/193; 341/115, 120, 155; 375/224, 225, 375/226; 714/724, 733, 734
See application file for complete search history.

(56) References Cited

U.S. PATENT DOCUMENTS

| | | | |
|---|---|---|---|
| 4,495,621 A | 1/1985 | Nakagomi et al. ............. | 371/6 |
| 5,162,674 A | 11/1992 | Allstot et al. ............... | 307/451 |
| 5,210,538 A | 5/1993 | Kuroiwa ...................... | 341/160 |
| 5,737,342 A | 4/1998 | Ziperovich .................. | 371/25.1 |
| 6,085,342 A | 7/2000 | Marholev et al. ............ | 714/724 |
| 6,211,803 B1* | 4/2001 | Sunter ........................ | 341/120 |
| 6,377,065 B1 | 4/2002 | Le et al. ..................... | 324/765 |
| 6,401,225 B1 | 6/2002 | Miura ......................... | 714/724 |
| 6,557,131 B1* | 4/2003 | Arabi ......................... | 714/734 |

FOREIGN PATENT DOCUMENTS

| | | |
|---|---|---|
| GB | 2313988 | 12/1997 |
| JP | 6291657 | 10/1994 |
| JP | 2002033661 | 1/2002 |
| WO | WO9800725 | 2/1999 |

\* cited by examiner

Primary Examiner—Bryan Bui
(74) Attorney, Agent, or Firm—Kunzler & Associates

(57) ABSTRACT

An apparatus, system, and method are disclosed for testing an analog to digital converter with a known analog signal applied. A first register module stores a first digitized instance of an analog signal. A second register module stores a second digitized instance of the analog signal. A difference module calculates the absolute difference between the first and second digitized instances. A bad code module identifies an erroneous digitized instance wherein the absolute difference is greater than a limit value. In one embodiment, a counter module counts the erroneous digitized instance. A test system may identify a failed analog to digital converter if the erroneous digitized instance count is greater than a specified target value.

30 Claims, 8 Drawing Sheets

APPARATUS, SYSTEM, AND METHOD FOR TESTING AN ANALOG TO DIGITAL CONVERTER

BACKGROUND OF THE INVENTION

1. Field of the Invention

This invention relates to testing analog to digital converters and more particularly relates to identifying low error-rate failures in analog to digital converters.

2. Description of the Related Art

An analog to digital converter ("ADC") is typically tested to assure proper function during operation. For example, a test system is used to introduce a known analog signal to the ADC. The ADC samples the analog signal and converts the analog signal to a digitally encoded instance or digital instance of the analog signal. The test system examines the digital instance to determine if the digital instance represents a value consistent with sampled analog signal.

Testing the ADC is usually successful in identifying repeatable discrepancies between the sampled analog signal and the corresponding value of the converted digital instance. Unfortunately, many anomalies that cause discrepancies between the sampled analog signal and the digital instance—herein referred to as erroneous digitized instances—("EDI") may only be occasionally manifest. For example, an EDI caused by noise in the ADC may only occur on average once in a million digital instances. Although a one in a million EDI may be a low error rate, the one in a million error rate may still be sufficiently high to render the ADC unusable for a function. For example, an ADC converting an analog signal from the read head of digital storage device such as a magnetic tape drive to a plurality of digital instances may convert so many digital instances that one in a million EDIs occur regularly and may degrade or render useless the ADC.

Unfortunately, testing an ADC a sufficient number of times to identify low error rate glitches using a test system is prohibitively expensive. Test systems for testing ADCs, particularly test systems for semiconductor ADCs, are expensive and each second of test time is a significant cost. A test system testing an ADC for a sufficient amount of time to identify low error rate EDIs by inputting a known analog signal and testing the output digitized instance of the analog signal may significantly increase the cost of the ADC. For example, inputting and testing the five million (5,000,000) analog signal/digitized instance pairs in order to accurately identify an ADC with a target error rate of two in ten million EDIs may require several seconds test system time for each ADC, greatly increasing test costs particularly if multiple ADCs must be tested on a semiconductor die.

From the foregoing discussion, it should be apparent that a need exists for an apparatus, system, and method for hardware-based testing for low error rate EDIs in an ADC. Beneficially, such an apparatus, system, and method would reduce the cost and increase the reliability of ADCs.

SUMMARY OF THE INVENTION

The present invention has been developed in response to the present state of the art, and in particular, in response to the problems and needs in the art that have not yet been fully solved by currently available analog to digital converter ("ADC") testing. Accordingly, the present invention has been developed to provide an apparatus, system, and method for testing analog to digital converters that overcome many or all of the above-discussed shortcomings in the art.

The apparatus to test an ADC is provided with a logic unit containing a plurality of modules configured to functionally execute the necessary steps of testing the ADC. These modules in the described embodiments include a first register module, a second register module, a difference module, a bad code module, and a counter module.

An ADC samples an analog signal and generates a plurality of digitized instances of the analog signal. The first register module stores a first digitized instance of the analog signal and the second register module stores a second digitized instance of the analog signal. In one embodiment, the second register module stores the first digitized instance from the ADC. Subsequently, the first register module may store the first digitized instance from the second register module and the second register may store the second digitized instance from the ADC.

The difference module is configured to calculate the absolute difference between the first and second digitized instances. For example, if the first digitized instance was seven (7) and the second digitized instance was sixteen (16), the absolute difference is nine (9). The bad code module compares the absolute difference with a limit value. In addition, the bad code module identifies an erroneous digitized instance wherein the absolute difference is greater than the limit value. For example, if the limit value is five (5) and the absolute difference is nine (9), the bad code module identifies an erroneous digitized instance.

In one embodiment, the analog signal is a known waveform such as a sine wave. In addition, the limit value may be selected such that the maximum absolute difference between the first digitized instance and the second digitized instance should not exceed the limit value for the known waveform. For example, an analog sine wave may be sampled by an ADC at regular intervals. The digital value of the maximum change in amplitude of the sine wave over one interval may be a value of three (3). The limit value may be set at three (3). Thus an absolute difference between the first digital instance and the second digital instance that exceeds three (3) is indicative of a discrepancy and is identified by the bad code module as an erroneous digitized instance.

The counter module is configured to count the erroneous digitized instance. In one embodiment, the counter module is reset to a specified initial value such as zero. The counter module may count the EDIs occurring for millions of digitized analog samples. The EDI count represents an error rate for the ADC. The EDI count identifies the ADC as failed if the count exceeds a specified target value. For example, the counter module may count EDIs for ten million (10,000,000) digitized analog signal samples. If the specified target value is ten (10), and the count module counts eleven (11) EDIs, the count indicates that the ADC has failed as the ADC's error rate is excessive.

The apparatus identifies error rate failures including low error rate failures of the ADC. In addition, the apparatus may reduce the resources required from an external test system needed to identify low error rate failures by testing a plurality of digitized instances without requiring a test system to verify the digital value of each digitized instance.

A system of the present invention is also presented to test ADCs. The system may be integrated with an ADC. In particular, the system, in one embodiment, is integrated in a semiconductor substrate with the ADC. The system includes a first register module, a second register module, a difference module, a bad code module, a counter module, and a test system. In addition, the system may include a limit register module and a test module such as a test system.

An ADC samples an analog signal and generates a plurality of digitized instances of the analog signal. The first register module stores a first digitized instance of the analog signal and the second register module stores a second digitized instance of the analog signal. The difference module calculates the absolute difference between the first and second digitized instances. The bad code module identifies an erroneous digitized instance wherein the absolute difference is greater than the limit value. In one embodiment, the limit register module is configured to store the limit value. The counter module counts the EDI.

The test module is in communication with the counter module. In one embodiment, the test module is a test system and communicates with the counter module through a communication channel such as a serial communications channel or serial loop. The counter module may communicate the EDI count to the test system. The test module is configured to identify a failed ADC if the EDI count is greater than a specified target value.

A method of the present invention is also presented for testing an analog to digital converter. The method in the disclosed embodiments substantially includes the steps necessary to carry out the functions presented above with respect to the operation of the described apparatus and system. In one embodiment, the method includes storing a first digitized instance, storing a second digitized instance, calculating the absolute difference, identifying an EDI, counting the EDI, and identifying a failed ADC.

In one embodiment, the limit register module stores the limit value. The first register module stores a first digitized instance of an analog signal and the second register module stores a second digitized instance of the analog signal. The difference module calculates the absolute difference between the first and second digitized instances. The bad code module identifies an EDI wherein the absolute difference is greater than the limit value. The counter module counts the EDI count. In one embodiment, a test system identifies a failed analog to digital converter if the erroneous digitized instance count is greater than a specified target value.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussion of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize that the invention can be practiced without one or more of the specific features or advantages of a particular embodiment. In other instances, additional features and advantages may be recognized in certain embodiments that may not be present in all embodiments of the invention.

The present invention calculates the absolute difference between a first and second digital instance of an analog signal and identifies an EDI as an absolute difference that exceeds a limit value. In addition, the present invention counts the erroneous digitized instances to identify an ADC failure if the erroneous digitized instance count exceeds a specified target value. These features and advantages of the present invention will become more fully apparent from the following description and appended claims, or may be learned by the practice of the invention as set forth hereinafter.

BRIEF DESCRIPTION OF THE DRAWINGS

In order that the advantages of the invention will be readily understood, a more particular description of the invention briefly described above will be rendered by reference to specific embodiments that are illustrated in the appended drawings. Understanding that these drawings depict only typical embodiments of the invention and are not therefore to be considered to be limiting of its scope, the invention will be described and explained with additional specificity and detail through the use of the accompanying drawings, in which.

DETAILED DESCRIPTION OF THE INVENTION

Figure 1A:
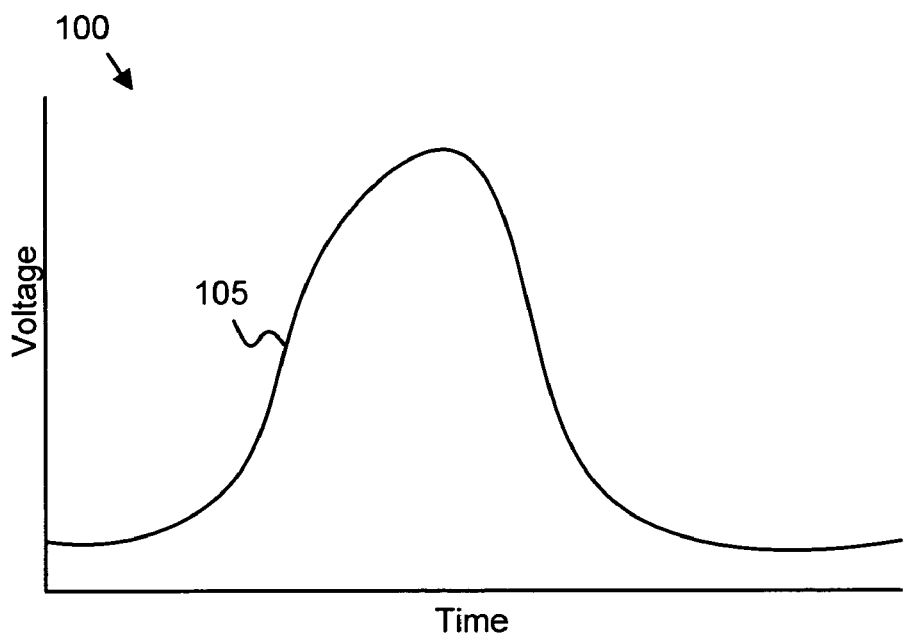
FIG. 1a illustrates one embodiment of an analog signal plot of the present invention.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices or the like.

Modules may also be implemented in software for execution by various types of processors. An identified module of executable code may, for instance, comprise one or more physical or logical blocks of computer instructions, which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of executable code may be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different storage devices, and may exist, at least partially, merely as electronic signals on a system or network.

Reference throughout this specification to "one embodiment," "an embodiment," or similar language means that a particular feature, structure, or characteristic described in connection with the embodiment is included in at least one embodiment of the present invention. Thus, appearances of the phrases "in one embodiment," "in an embodiment," and similar language throughout this specification may, but do not necessarily, all refer to the same embodiment.

Furthermore, the described features, structures, or characteristics of the invention may be combined in any suitable manner in one or more embodiments. In the following description, numerous specific details are provided, such as examples of programming, software modules, user selections, network transactions, database queries, database structures, hardware modules, hardware circuits, hardware chips, etc., to provide a thorough understanding of embodiments of the invention. One skilled in the relevant art will recognize, however, that the invention can be practiced without one or more of the specific details, or with other methods, components, materials, and so forth. In other instances, well-known structures, materials, or operations are not shown or described in detail to avoid obscuring aspects of the invention.

FIG. 1a illustrates one embodiment of an analog signal plot 100. The analog signal plot 100 shows the voltage of an analog signal 105 as a function of time. The voltage of the analog signal 105 may vary over time. In an alternate embodiment, the current of the analog signal 105 varies over time.

Figure 1B:
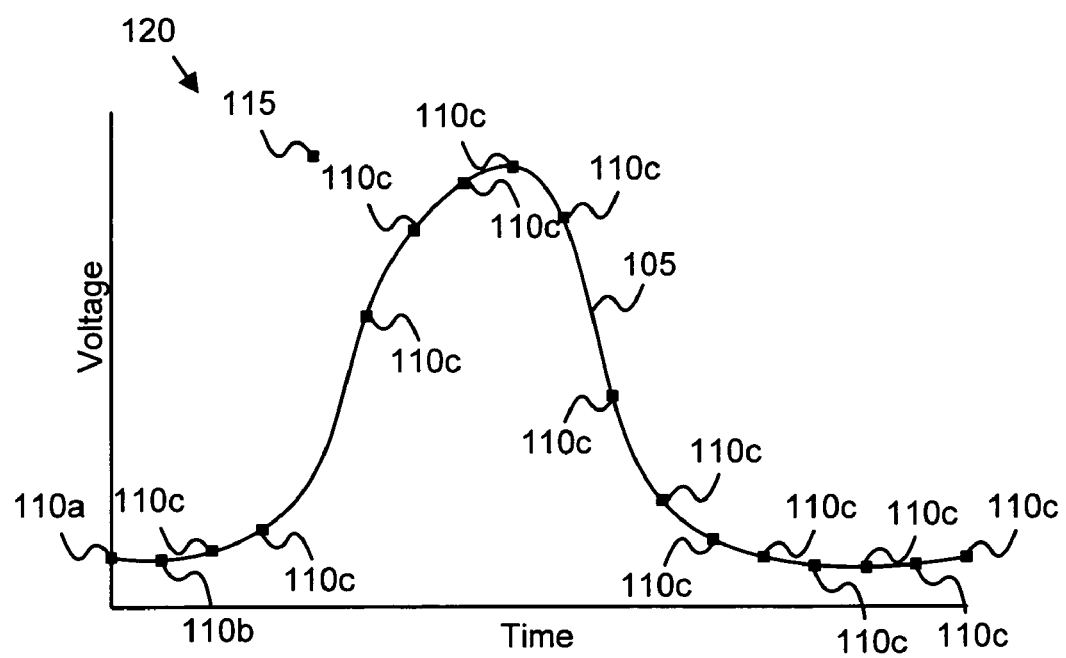
FIG. 1b illustrates of one embodiment a plot of an analog signal and a plurality of digitized instances of the analog signal in accordance with the present invention.

FIG. 1b illustrates of one embodiment a plot 120 of the analog signal 105 and a plurality of digitized instances 110 of the analog signal. The analog signal 105 is sampled at intervals by an analog to digital converter ("ADC"). In one embodiment, the analog signal 105 is sampled every n clock cycles, where n is an integer. For example, if n is two (2), the analog signal 105 is sampled every two (2) clock cycles. The ADC converts each sample into a digitally encoded representation of the sample instance referred to herein as a digitized instance 110. The digitized instance 110 is typically an approximate representation of the analog signal 105. However, the ADC may occasionally generate an erroneous digitized instance ("EDI") 115. Noise, the simultaneous switching of many of the digitized instance bit values, or an ADC fabricated outside of manufacturing tolerances may cause the EDI 115. The ADC may only infrequently generate the EDI 115. Such infrequent EDIs may be difficult to detect using standard testing methods that input a known analog signal and then verify that the generated digitized instance 110 of the known analog signal 105 has the correct value. For example, an EDI 115 that only occurs on average once in a million samples may be undetectable using a test that only verifies the digital instances 110 of ten thousand (10,000) samples. Yet testing several million digital instances 110 may require an impractical amount of testing and significantly increase test costs.

Figure 2:
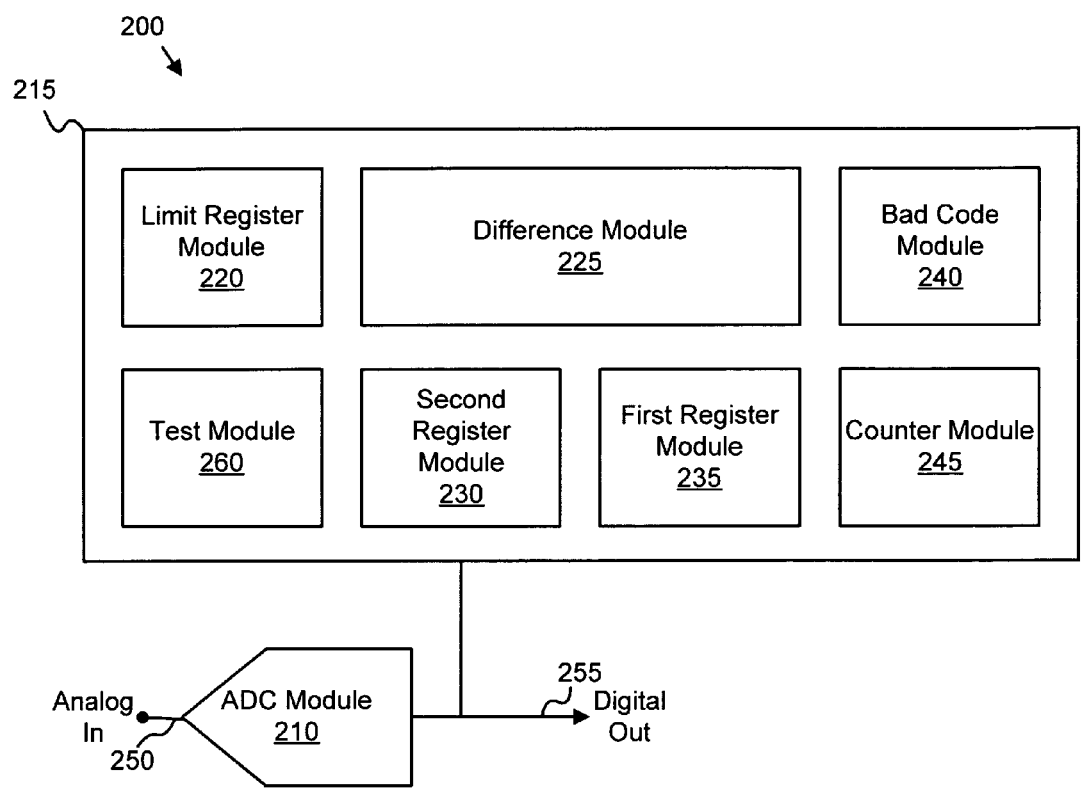
FIG. 2 is a schematic block diagram illustrating one embodiment of an analog to digital converter test system of the present invention.

FIG. 2 is a schematic block diagram illustrating one embodiment of an analog to digital converter test system 200 of the present invention. The system 200 includes an ADC 210 with an analog input 250 and a digital output 255, a first register module 235, a second register module 230, a difference module 225, a bad code module 240, a counter module 245. In one embodiment, the system 200 also includes a limit register module 220, and a test module 260.

The ADC 210 receives an analog signal 105 at the analog input 250, samples the analog signal 105, and generates a digitized instance 110 of the analog signal 105 that is available at the digital out 255. The digital out 255 may be a digital signal bus with one digital signal line for each bit of the digitized instance 110. The first register module 235 stores a first digitized instance 110a and the second register module 230 stores a second digitized instance 110b. In one embodiment, the second digitized instance 110b is generated immediately subsequent to the first digitized instance 110a. In an alternate embodiment, the second digitized instance 110b is generated from a sample of the analog signal sampled a specified number of samples after of the first digital instance 110a.

The difference module 225 calculates the absolute difference between the first and second digitized instances 110a, 110b. The bad code module 240 identifies an EDI 115 wherein the absolute difference is greater than a limit value. In one embodiment, the limit register module 220 stores the limit value. The counter module 245 counts the EDI 115. The counter module's sum of EDIs 115 is an EDI count.

The test module 260 is in communication with the counter module 245. In one embodiment, the test module 260 is a test system and communicates with the counter module 245 through a communication channel such as a serial communications channel or serial loop. The test module 260 is configured to identify the failed ADC 210 if the EDI count is greater than a specified target value. The first register module 235, the second register module 230, the difference module 225, the bad code module 240, and the counter module 245 may be integrated in an error detector module 215. In a certain embodiment, the limit module 220 and test module 260 are also integrated in the error detector module 215. The error detector module 215 may be implemented with a small number of semiconductor gates and may be integrated in a semiconductor device with the ADC 210. The system 200 may test a large number of first and second digitized instance 110a, 110b pairs with minimal external resources to identify low error rate failures at a reduced cost.

Figure 3:
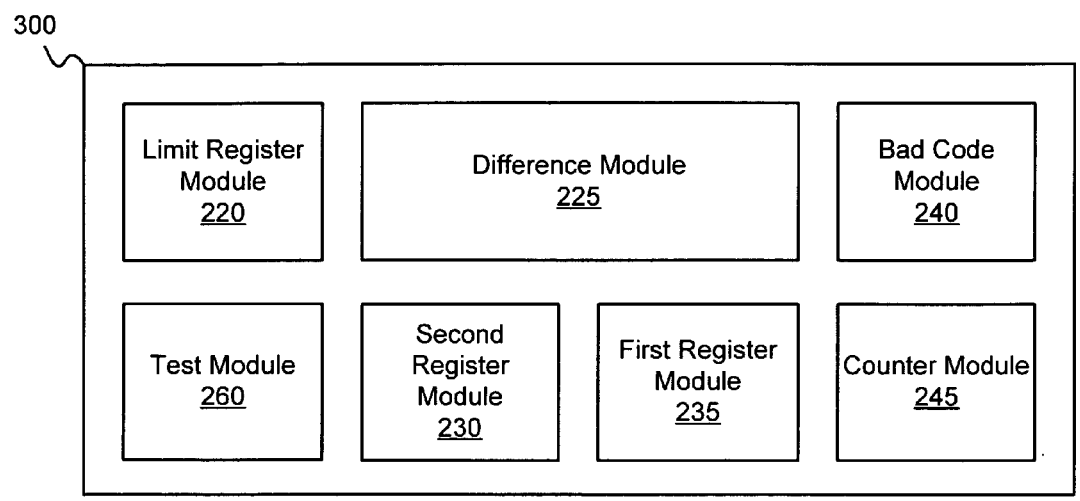
FIG. 3 is a schematic block diagram illustrating one embodiment of an analog to digital converter test apparatus of the present invention.

FIG. 3 is a schematic block diagram illustrating one embodiment of an ADC test apparatus 300 of the present invention. The ADC 210 samples an analog signal 105 and generates a plurality of digitized instances 110 of the analog signal 105. The first register module 235 stores a first digitized instance 110a and the second register module 230 stores a second digitized instance 110b. In one embodiment, the second register module 230 stores the first digitized instance 110a from the ADC 210. Subsequently, the first register module 235 may store the first digitized instance 110a from the second register module 230 and the second register 230 may store the second digitized instance 110b from the ADC 210.

The difference module 225 is configured to calculate the absolute difference between the first and second digitized instances 110a, 110b. For example, if the first digitized instance 110a represents a seven millivolt (7 mV) analog signal 105 and the second digitized instance 110b represents a sixteen millivolt (16 mV) analog signal 105, the absolute difference represents nine millivolts (9 mV) wherein the absolute difference is a digitally encoded representation. The bad code module 240 compares the absolute difference with a limit value. In one embodiment, the limit register module 220 stores the limit value. In a certain embodiment, the limit register module 220 is manufactured with the limit value. For example, the limit register module 220 may be preprogrammed with the limit value as a read only memory ("ROM") value. In an alternate embodiment, the limit value is dynamically loaded into the limit register module 220. For example, the limit value may be stored in the limit register module 220 through a communications channel such as a serial loop as is well known to those skilled in the art.

The bad code module 240 identifies an EDI 115 if the absolute difference is greater than the limit value. For example, if the limit value represents five millivolts (5 mV) and the absolute difference represents nine millivolts (9 mV), the bad code module 240 identifies an EDI 115. Either the first digitized instance 110a or the second digitized instance 110b could be the EDI 115, but one of the first and second digitized instances 110a, 110b is an EDI 115. In one embodiment, the analog signal 105 is a known waveform such as a sine wave. In addition, the limit value may be selected such that the maximum absolute difference between the first digitized instance 110a and the second digitized instance 110b should not exceed the limit value for the known waveform.

The counter module 245 is configured to count the EDI 115. In one embodiment, the counter module 245 is reset to a specified initial value such as zero at the start of a test. In a certain embodiment, the counter module 245 is directed to start counting at the beginning of a test. For example, the test module 260 may direct the counter module 245 to start counting. The counter module 245 may count the EDIs 115 occurring in a set of ten million (10,000,000) digitized instance 110 pairs. The EDI count divided by the number of digitized instance pairs is an error rate for the ADC 210. The EDI count identifies the ADC 210 as failed if the EDI count exceeds a specified target value. For example, the counter module 245 may count EDIs 115 for ten million (10,000,000) digitized instances 110 of analog signal samples 105. If the specified target value is ten (10) EDIs 115, and the count module 245 counts eleven (11) EDIs 115, the EDI count indicates that the ADC 210 has failed as the ADC's 210 error rate is excessive.

In one embodiment, a digitized instance 110 discrepancy or EDI 115 may cause the counter module 245 to count two EDIs 115, the first when the discrepancy is the second digitized instance 110b and the second when the discrepancy is the first digitized instance 110a. The limit value may be selected to account for double counting of EDIs 115. In an alternate embodiment, the bad code module 240 does not identify a second EDI 115 n clock cycles subsequent to a first EDI 115 where n is the number of clock cycles between the generation of digitized instances 110.

In one embodiment, the test module 260 directs the counter module 245 to pause counting. The test module 260 may further receive the EDI count from the counter module 245. The test module 260 may identify that the ADC 210 is failed if the EDI count is greater than the specified target value. In one embodiment, the test module 260 is an external test system. The apparatus 300 identifies error rate failures including low error rate failures for an ADC 210. In addition, the apparatus 300 may reduce the resources required from an external test system needed to identify low error rate failures by testing a plurality of digitized instances 110 without requiring a test system to verify the digital value of each digitized instance 110.

Figure 4:
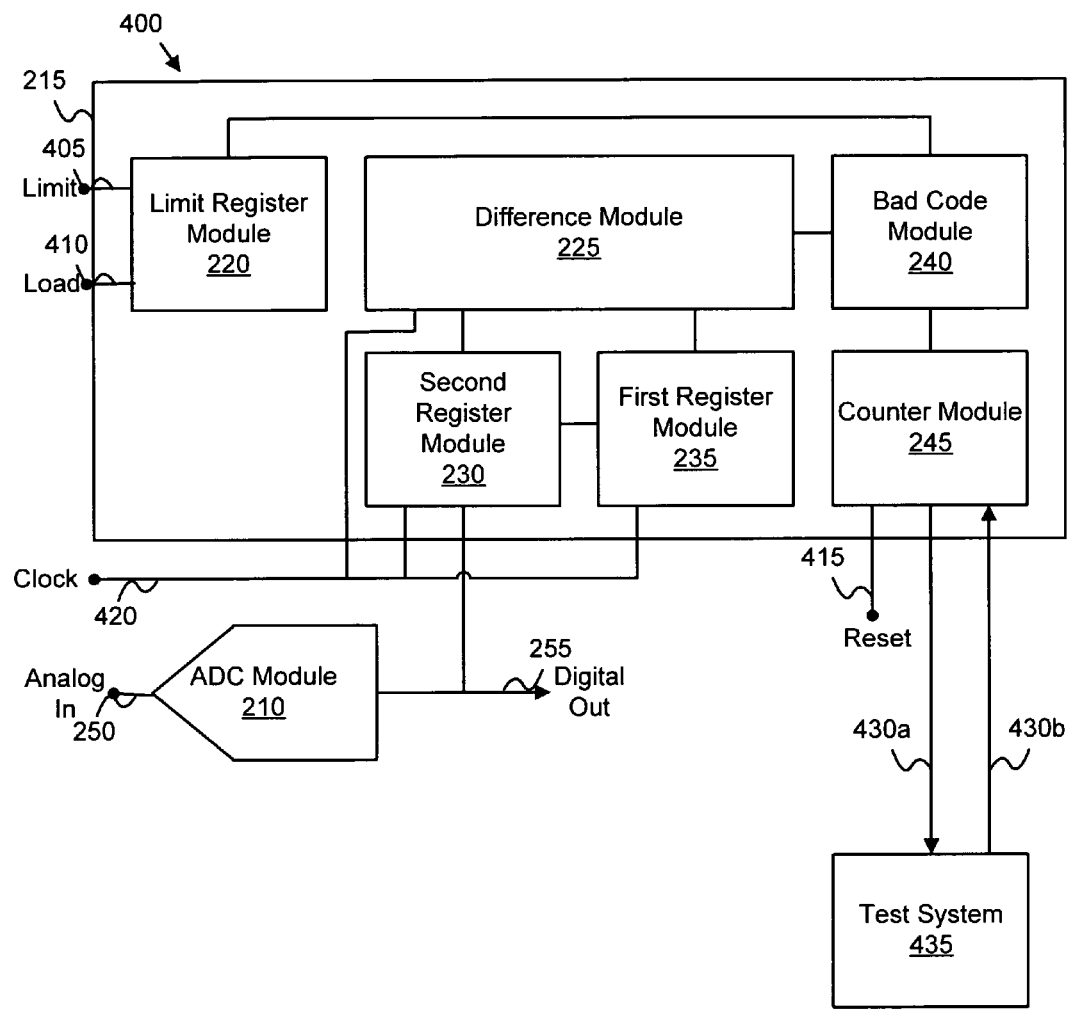
FIG. 4 is a schematic block diagram illustrating one embodiment of a test system in accordance with the present invention.

FIG. 4 is a schematic block diagram illustrating one embodiment of a test system 400 in accordance with the present invention. A digitized output 255 of an ADC 210 is stored by the second register module 230 as the first digitized instance 110a. In one embodiment, the second register module 230 may latch the first digitized instance 110a from the digital out 255 on a clock edge. On the subsequent $n^{th}$ clock edge where n is the number of clock cycles between samples, the first register module 235 may latch the first digitized instance 110a from the second register module 230 as the second register module 230 latches a second digitized instance 110b from the digital output 255 of the ADC 210.

The difference module 225 receives the first digitized instance 110a from the first register module 235 and the second digitized instance 110b from the second register module 230. In addition, the difference module 225 calculates the absolute difference of the first digitized instance 110a and the second digitized instance 110b. The absolute difference may be encoded as a two's compliment binary number. The bad code module 240 receives the absolute difference and the limit value as inputs and compares the absolute difference and the limit value. If the absolute difference is greater than the limit value, the bad code module 240 identifies an EDI 115. For example, the bad code module may identify the EDI 115 by asserting an electrical communication channel such as a digital data line in communication with the counter module 245.

The counter module 245 counts each EDI 115. In one embodiment, the counter module 245 is in communication with a test system 435 through a communication system. In a certain embodiment, the communication channel is a serial loop 430. The test system 435 may be physically separate from the error detector module 215 and the ADC 210. For example, the test system 435 may be a semiconductor test device that tests the ADC 210 by electrically communicating through or probing the serial loop input 430b and the serial loop output 430a. Instructions such as a reset instruction configured to reset the counter module 245 or a read instruction configured to direct the counter module 245 to output the EDI count may be communicated to counter module 245 through the serial loop input 430b.

The counter module 240 may communicate the EDI count to the test system 435 through the serial loop output 430a. The test system 435 determines if the ADC 210 is failed if the EDI count is greater than a specified target value. The system 400 may test many digitized instances 110 from the ADC 110 with the test system 435 only starting and pausing the test, and receiving the results of the test.

Figure 5:
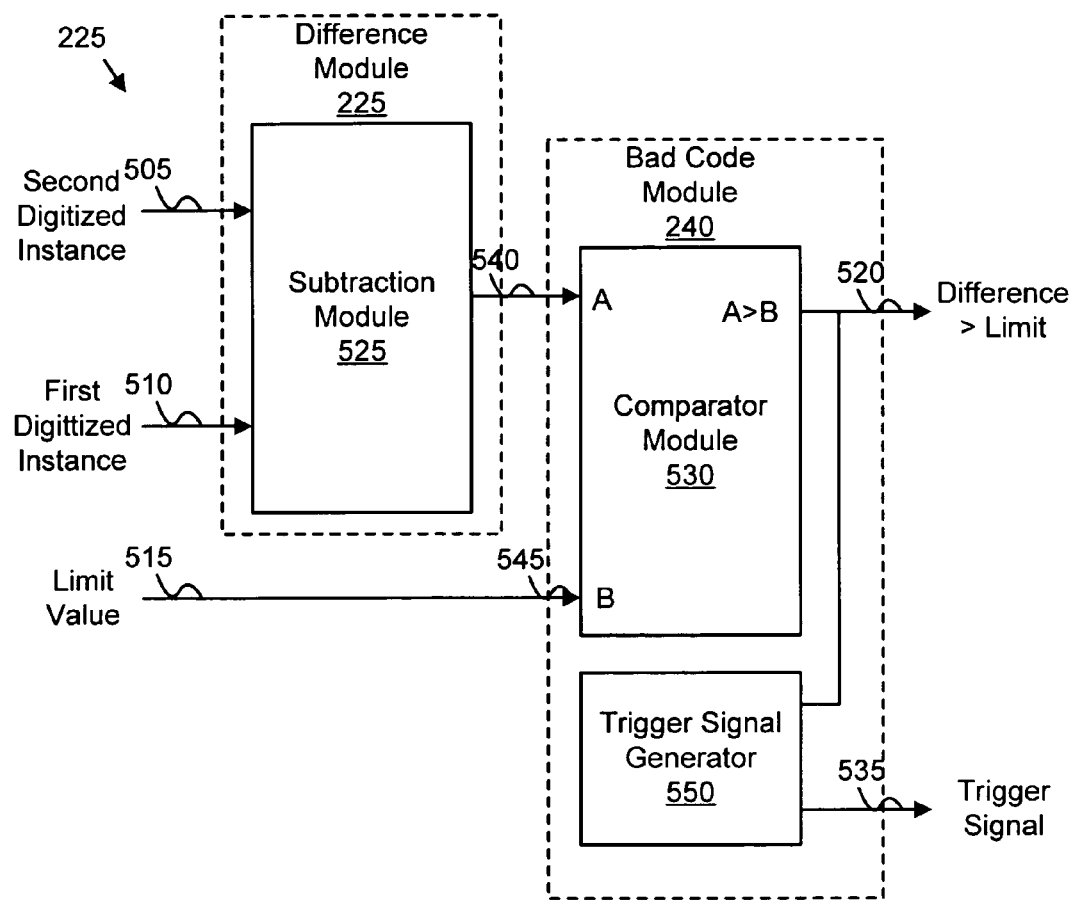
FIG. 5 is a schematic block diagram illustrating one embodiment of the difference and bad code modules of the present invention.

FIG. 5 is a schematic block diagram illustrating one embodiment of the difference and bad code modules 500 of the present invention. The difference module 225 comprises a subtraction module 525. The subtraction module 525 receives the second digitized instance 110b over a second instance parallel digital signal bus 505 and the first digitized instance 110a over a first instance parallel digital signal bus 510. In addition, the subtraction module 525 outputs the absolute difference over a difference parallel digital signal bus 540. The subtraction module 525 may be implemented as semiconductor gates configured as a digital subtraction circuit as is well known to those skilled in the art.

The bad code module 240 comprises a comparator 530. The comparator 530 receives the absolute difference over the difference parallel digital signal bus 540 into the A inputs and receives the limit value over a limit value parallel data bus 515 into the B inputs. In one embodiment, the limit value parallel bus 515 comprises the most significant bits of the limit value with the least significant bits of the limit value parallel data bus 515 set to a specified digital value such as all zeros. The comparator 530 asserts the A>B digital signal output 520 if the absolute difference is greater than the limit value. In one embodiment, the comparator 530 is implemented as semiconductor gates configured as a digital comparator circuit as is well known to those skilled in the art.

In one embodiment, the bad code module 240 further comprises a trigger signal module 550. The trigger signal module 550 generates a trigger signal 535 from the A>B digital signal output 520. The trigger signal 535 may be used to capture an EDI 115 using a digital analyzer.

Figure 6:
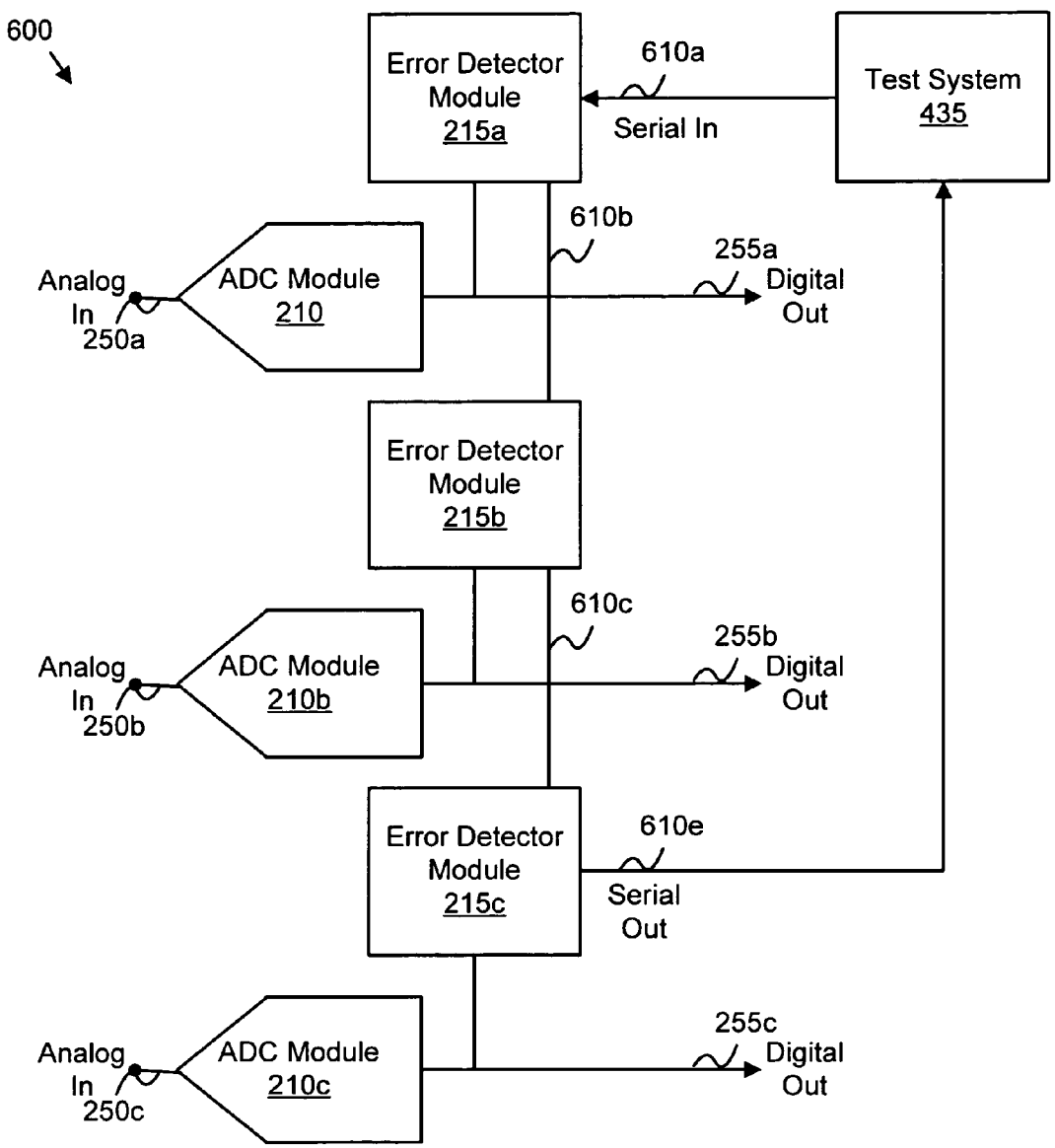
FIG. 6 is a schematic block diagram illustrating one embodiment of a test loop system of the present invention.

FIG. 6 is a schematic block diagram illustrating one embodiment of a test loop system 600 of the present invention. The system 600 includes a plurality of error detector modules 215 testing a plurality of ADCs 210. Although the system 600 is depicted with three error detector modules 215 and three ADCs 210, any number of error detector modules 215 and ADCs 210 may be employed.

A test system 435 communicates with the error detector modules 215 through a communication channel 610. The communication channel 610 may be a serial communication channel. The test system 435 communicates commands to the error detector modules 215 through the communications channel 610 and receives EDI counts from the error detector modules 215 through the communication channel 610. The system 600 allows the test system 435 to test a plurality of ADCs with a plurality of error detector modules 215 with reduced communication channels 610.

The following schematic flow chart diagrams that follow are generally set forth as logical flow chart diagrams. As such, the depicted order and labeled steps are indicative of one embodiment of the presented method. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method. Although various arrow types and line types may be employed in the flow chart diagrams, they are understood not to limit the scope of the corresponding method. Indeed, some arrows or other connectors may be used to indicate only the logical flow of the method. For instance, an arrow may indicate a waiting or monitoring period of unspecified duration between enumerated steps of the depicted method. Additionally, the order in which a particular method occurs may or may not strictly adhere to the order of the corresponding steps shown.

Figure 7:
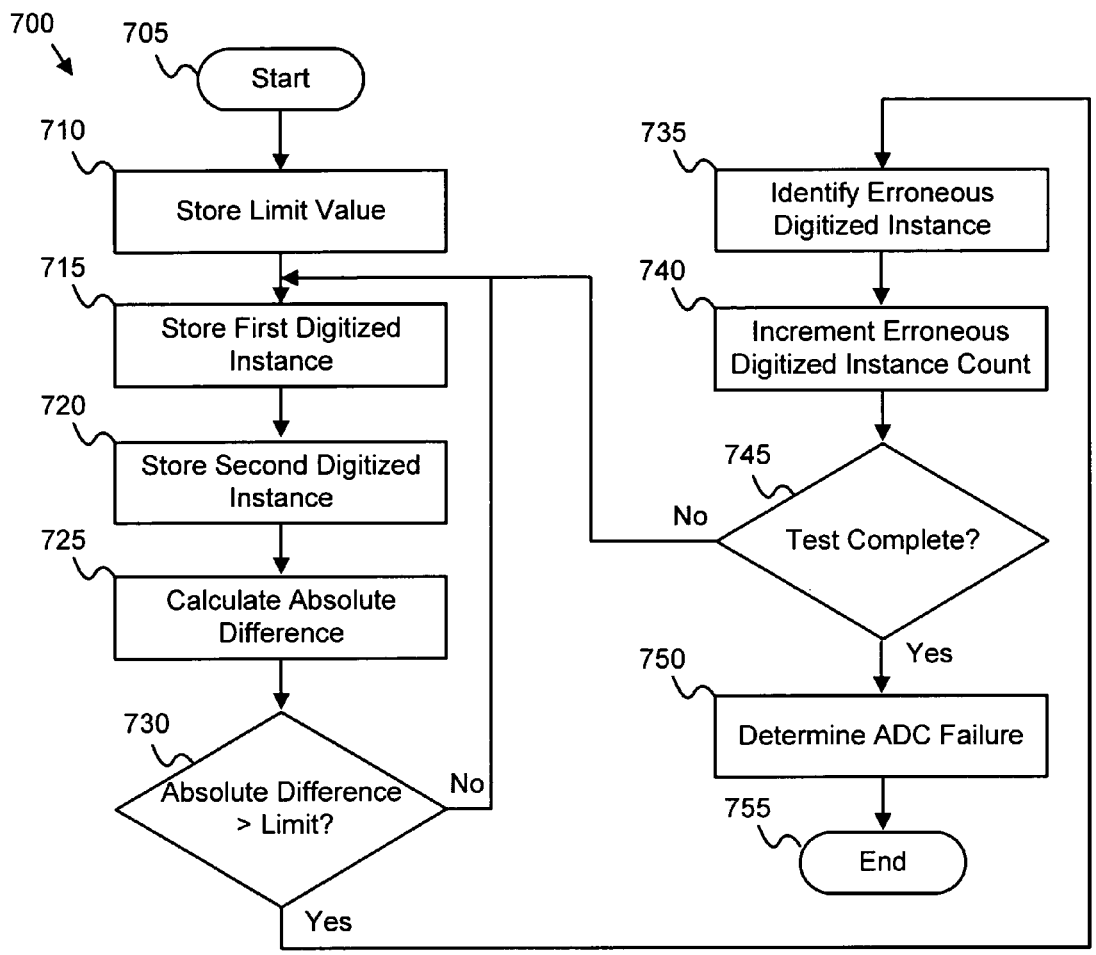
FIG. 7 is a schematic flow chart diagram illustrating one embodiment of an analog to digital converter testing method in accordance with the present invention.

FIG. 7 is a schematic flow chart diagram illustrating one embodiment of an analog to digital converter testing method 700 in accordance with the present invention. The method begins 705, and in one embodiment, the limit register module 220 stores 710 a limit value. The limit register module 220 may receive the limit value from a test system 435. In a certain embodiment, the test system 435 communicates the limit value through a communications channel 610 such as a serial communications channel. In an alternate embodiment, the limit register module is fabricated with the limit value stored 710 in a ROM.

In one embodiment, the limit value is selected for a known analog waveform such that the maximum absolute difference between a first digital instance 110a and a second digital instance 110b should not exceed the limit value for the known waveform. For example, an analog sine wave may be sampled by an ADC 210 every microsecond. The digital value of the maximum change in amplitude of the sine wave over one microsecond (1 µs) may be a value of three microvolts (3 µV). The limit value may therefore be set at the digital representation of three microvolts (3 µV). Thus an absolute difference between the first digital instance 110a and the second digital instance 110b that exceeds three microvolts (3 µV) is indicative of a discrepancy and is identified by the bad code module 240 as an EDI.

The first register module 235 stores 715 a first digitized instance 110a of an analog signal 105. In one embodiment, the first register module 235 stores 715 the first digitized instance 110a from the second register module 230. The second register module 230 stores 720 a second digitized instance 110b of the analog signal 105. The first digitized instance 110a and the second digitized instance 110b each represent digitized instances 110 of the analog signal 105 sampled at different times.

The difference module 220 calculates 725 the absolute difference between the first digitized instance 110a and the second digitized instance 110b. In one embodiment, the difference module 220 may output the absolute difference as a parallel digital number over a parallel digital bus. The bad code module 240 determines 730 if the absolute difference is greater than the limit value. If the absolute difference is not greater than the limit value, the first register module 235 stores 715 a next first digitized instance 110a and the second register module 230 stores 715 a next second digitized instance 110b. In one embodiment, the next first digitized instance 110a is the current second digitized instance 110b.

If the absolute difference is greater than the limit value, the bad code module 240 identifies 735 an EDI 115 has occurred. In a certain embodiment, the bad code module 240 outputs a trigger signal identifying the EDI 115. In one embodiment, the counter module 245 increments 740 an EDI count. The EDI count sums each EDI. In one embodiment, the counter module 245 does not count a second EDI 115 subsequent to a first EDI 115 if the second EDI 115 is n clock cycles after the first EDI 115 where n is the number of clock cycles between digitized instances 110. The EDI count may be reset to zero at the beginning of a test. The EDI count is indicative of the error rate of the ADC 210 under test. For example, the error rate of the ADC 210 may be calculated as the EDI count divided by the number of first and second digitized instance 110a, 110b pairs that have been tested. Thus if ten million (10,000,000) first and second digitized instance 110a, 110b pairs are tested and the erroneous digitized instance count is five (5), the error rate is five ten millionths ($5 \times 10^{-7}$).

In one embodiment, a test system 435 determines 745 if the test is complete. The test system 435 may communicate with the error detector module 215 through a communications channel 610 such as the serial communications channel. The test system 535 may specify the number of first and second digitized instance 110a, 110b pairs tested. For example, the test system 435 may reset the counter module 245 to zero and direct the counter module 245 to count EDIs 115. The test system 435 may further activate a clock and an analog input. The test system 435 may determine 745 the test is complete when a specified number of first and second digitized instance 110a, 110b pairs have been tested. In a certain embodiment, the test system 435 determines 745 the test is complete when a specified time interval of test time has elapsed.

In an alternate embodiment, a test module 460 integrated in the error detector module 215 determines 745 if the test is complete. The test module 460 may count the first and second digitized instance 110a, 110b pairs tested by the error detector module 215. The first and second digitized instance 110a, 110b pair count may be initialized to zero (0) at the beginning of the test. The test module 460 may determine 745 the count is complete when a specified number of first and second digitized instance 110a, 110b pairs have been tested.

In one embodiment, the test system 435 identifies 750 if the ADC 210 under test has failed. The test system 435 may compare the EDI count to a specified target value. For example, the test system 435 may compare an EDI count of eleven (11) with a target value of eight (8) and identify that the ADC 210 under test failed as the EDI count is greater than the specified target value. In an alternate embodiment, the test system 435 calculates a error rate from the EDI count and identifies 750 if the error rate exceeds a specified error rate.

In an alternate embodiment, the test module 260 identifies 750 if the ADC 210 under test has failed. The test module 260 may determine 750 that the ADC 210 under test failed by comparing the EDI count to a specified target value, and if the EDI count is greater than the specified target, the ADC 210 failed. The method 700 identifies 750 a failed ADC 210 by determining 730 an EDI 115 from the absolute difference of a first and second digitized instance 110a, 110b compared with a limit value and by counting the EDIs 115. The EDI count indicates the error rate of the ADC 210 under test.

Figure 8:
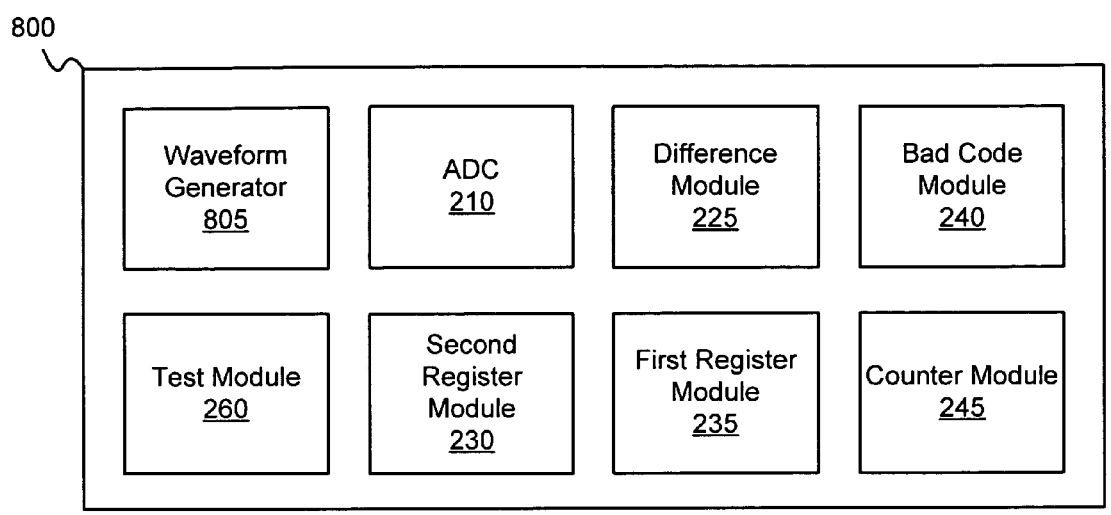
FIG. 8 is a schematic diagram illustrating one embodiment of a self-testing apparatus in accordance with the present invention.

FIG. 8 is a schematic flow chart diagram illustrating one embodiment of a self-testing apparatus 800 in accordance with the present invention. The apparatus 800 includes an ADC 210, a first register module 235, a second register module 230, a difference module 225, a bad code module 240, a counter module 245, a limit register module 220, a test module 260, and a waveform generator 805. The ADC 210, the first register module 230, the second register module 235, the difference module 225, the bad code module 240, the counter module 245, the limit register module 220, the test module 260, and the waveform generator 805 may be integrated in a semiconductor device. The semiconductor device may also include the ADC 210.

The limit register module 220 is manufactured with a programmable limit value. The waveform generator 805 generates a known waveform as an analog signal 105 and the ADC 210 receives the known waveform in response to a test command. The ADC 210 samples the waveform at periodic intervals and outputs a plurality of digitized instances 110. The first register module 235 stores 715 a first digitized instance 110a and the second register module 230 stores 720 a second digitized instance 110b.

The difference module 225 calculates the absolute difference of the first and second digitized instances 110a, 110b and the bad code module 240 determines if the absolute difference is greater than the limit value. If the absolute difference is greater than the limit value, the counter module 245 increments the EDI count. The test module 260 determines if the ADC 210 is failed if the EDI count is greater than a specified target value. The test module 260 may be manufactured with the specified target value in ROM or may be programmable. The test module 260 may communicate an ADC 210 failure. The self-testing apparatus 800 identifies an ADC 210 failure including low-error rate failures without an external test system 435.

The present invention calculates the absolute difference between a first and second digital instance 110a, 110b of an analog signal 105 and identifies an EDI 115 as an absolute difference that exceeds a limit value rather than inputting a known analog signal to and ADC 210 and determining if the digitized instance 110 generated by the ADC 210 is accurate. In addition, the present invention counts the EDI 115 to identify an ADC 210 failure if the EDI count exceeds a specified target value. The present invention is differentiated from the prior art by using pairs of digitized instances 110 of a sampled analog signal 105 to identify an EDI 115 instead of employing a test system 435 to determine if each digitized instance 110 is erroneous. In addition, the present invention may test many digitized instance 110 pairs rapidly and with minimal test system 435 intervention and identify even low-error rate ADC 210 failures using minimal test system 435 test time. As a result, the present invention supports the cost-effective identification of ADCs 210 that are unusable because of excessive though infrequent EDIs.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An apparatus to test an analog to digital converter, the apparatus comprising:
   a first register module configured to store a first digitized instance of an analog signal;
   a second register module configured to store a second digitized instance of the analog signal;
   a difference module configured to calculate the absolute difference between the first and second digitized instances;
   a bad code module configured to compare the absolute difference with a limit value and identify an erroneous digitized instance wherein the absolute difference is greater than the limit value; and
   a counter module configured to count the erroneous digitized instance.

2. The apparatus of claim 1, further comprising a test module configured to identify a failed analog to digital converter if the erroneous digitized instance count is greater than a specified target value.

3. The apparatus of claim 1, wherein the counter module is configured to communicate the erroneous digitized instance count to a test system configured to identify a failed analog to digital converter if the erroneous digitized instance count is greater than a specified target value.

4. The apparatus of claim 1, wherein the first register module, the second register module, the difference module, the bad code module, and the counter module are integrated with the analog to digital converter in a semiconductor device.

5. The apparatus of claim 1, further comprising a limit register module configured to store the limit value.

6. The apparatus of claim 1, wherein the analog signal is configured as a known waveform.

7. The apparatus of claim 6, further comprising a clock signal, wherein the first register module stores the first digital instance at a first clock transition and the second register module stores the second digital instance at a second clock transition, and wherein the limit value is selected such that the maximum absolute difference between the first digital instance and the second digital instance should not exceed the limit value for the known waveform.

8. The apparatus of claim 1, wherein the bad code module is further configured to output a trigger signal responsive to detecting the erroneous digitized instance.

9. An apparatus to self-test an analog to digital converter, the apparatus comprising:
   a waveform generator configured to generate a known waveform as an analog signal;
   an analog to digital converter configured to convert the known waveform to a plurality of digitized instances;
   a first register module configured to store a first digitized instance of the known waveform;
   a second register module configured to store a second digitized instance of the known waveform;
   a difference module configured to calculate the absolute difference between the first and second digitized instances;

a bad code module configured to compare the absolute difference with a limit value and identify an erroneous digitized instance wherein the absolute difference is greater than the limit value;

a counter module configured to count the erroneous digitized instance; and a test module configured to identify the analog to digital converter is failed if the erroneous digitized instance count is greater than a specified target value.

10. A system to test an analog to digital converter, the system comprising:

a first register module configured to store a first digitized instance of an analog signal;

a second register module configured to store a second digitized instance of the analog signal;

a difference module configured to calculate the absolute difference between the first and second digitized instances;

a bad code module configured to compare the absolute difference with a limit value and identify an erroneous digitized instance wherein the absolute difference is greater than the limit value;

a counter module configured to count the erroneous digitized instance; and a test system in communication with the counter module configured to identify a failed analog to digital converter if the erroneous digitized instance count is greater than a specified target value.

11. The system of claim 10, wherein the first register module, the second register module, the difference module, the bad code module, and the counter module are integrated with the analog to digital converter in a semiconductor device.

12. The system of claim 10, further comprising a limit register module configured to store the limit value.

13. The system of claim 10, wherein the analog signal is configured as a known waveform.

14. The system of claim 13, further comprising a clock signal, wherein the first register module stores the first digital instance at a first clock transition and the second register module stores the second digital instance at a second clock transition, and wherein the limit value is selected such that the maximum absolute difference between the first digital instance and the second digital instance should not exceed the limit value for the known waveform.

15. The system of claim 10, wherein the counter module is configured with a serial communication channel in communication with the test system.

16. The system of claim 10, wherein the bad code module is further configured to output a trigger signal responsive to detecting the erroneous digitized instance.

17. A signal bearing medium tangibly embodying a program of machine-readable instructions executable by a digital processing apparatus to perform operations to test an analog to digital converter comprising operations to:

store a first digitized instance of an analog signal;

store a second digitized instance of the analog signal;

calculate the absolute difference of the first digitized instance and the second digitized instance;

identify an erroneous digitized instance wherein the absolute difference is greater than a limit value;

count the erroneous digitized instance; and identify a failed analog to digital converter if the erroneous digitized instance count is greater than a specified target value.

18. The signal bearing medium of claim 17, wherein the instructions further comprise operations to communicate the erroneous digitized instance count over a communications channel.

19. The signal bearing medium of claim 18, wherein the communications channel is a serial communications channel.

20. The signal bearing medium of claim 17, wherein the instructions further comprise operations to generate a known waveform as the analog signal.

21. The signal bearing medium of claim 20, wherein the instructions further comprise operations to select the limit value such that the maximum absolute difference between the first digital instance and the second digital instance should not exceed the limit value for the known waveform.

22. The signal bearing medium of claim 17, wherein the instructions further comprise operations to start the erroneous digitized instance count.

23. The signal bearing medium of claim 17, wherein the instructions further comprise operations to reset the erroneous digitized instance count.

24. The signal bearing medium of claim 17, wherein the instructions further comprise operations to pause the erroneous digitized instance count.

25. The signal bearing medium of claim 17, wherein the instructions further comprise operations to load the limit value.

26. A method for testing an analog to digital converter, the method comprising:

storing a first digitized instance of an analog signal;

storing a second digitized instance of the analog signal;

calculating the absolute difference of the first digitized instance and the second digitized instance;

identifying an erroneous digitized instance wherein the absolute difference is greater than a limit value;

counting the erroneous digitized instance; and identifying a failed analog to digital converter if the erroneous digitized instance count is greater than a specified target value.

27. The method of claim 26, wherein the method comprises communicating the erroneous digitized instance count over a communications channel.

28. The method of claim 26, wherein the analog signal is configured as a known waveform.

29. The method of claim 28, further comprising selecting the limit value such that the maximum absolute difference between the first digital instance and the second digital instance should not exceed the limit value for the known waveform.

30. An apparatus to test an analog to digital converter, the apparatus comprising:

means for storing a first digitized instance of an analog signal;

means for storing a second digitized instance of the analog signal;

means for calculating the absolute difference of the first digitized instance and the second digitized instance;

means for identifying an erroneous digitized instance wherein the absolute difference is greater than a limit value;

means for counting the erroneous digitized instance; and means for identifying a failed analog to digital converter if the erroneous digitized instance count is greater than a specified target value.

* * * * *